United States Patent
Ito

(10) Patent No.: US 7,442,625 B2
(45) Date of Patent: Oct. 28, 2008

(54) APPARATUS FOR ANNEALING, METHOD FOR ANNEALING, AND METHOD FOR MANUFACTURING A SEMICONDUCTOR DEVICE

(75) Inventor: Takayuki Ito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 11/473,150

(22) Filed: Jun. 23, 2006

(65) Prior Publication Data

US 2006/0292759 A1    Dec. 28, 2006

(30) Foreign Application Priority Data

Jun. 28, 2005    (JP)    ............................. P2005-188209

(51) Int. Cl.
*H01L 21/46* (2006.01)
*H01L 21/78* (2006.01)
*H01L 21/301* (2006.01)

(52) U.S. Cl. .................. 438/463; 438/467; 438/663; 438/553; 257/E21.17; 257/E21.051; 257/E21.134; 257/E21.328; 257/E21.347

(58) Field of Classification Search ................ 438/463, 438/197, 199, 467, 502, 509, 506, 513, 535, 438/536, 663, 680, 712
See application file for complete search history.

(56) References Cited

U.S. PATENT DOCUMENTS

| 4,059,461 | A  | * | 11/1977 | Fan et al. ..................... 438/92 |
| 4,151,008 | A  |   | 4/1979  | Kirkpatrick |
| 5,620,905 | A  | * | 4/1997  | Konuma et al. ............. 438/163 |
| 7,060,581 | B2 |   | 6/2006  | Ito et al. |
| 2003/0193066 | A1 | * | 10/2003 | Ito et al. ..................... 257/335 |
| 2006/0216875 | A1 | * | 9/2006  | Ito et al. ..................... 438/149 |
| 2006/0225657 | A1 | * | 10/2006 | Mizushima et al. ......... 118/724 |

FOREIGN PATENT DOCUMENTS

| JP | 2002-057301 | 2/2002 |
| JP | 2002-252174 | 9/2002 |

\* cited by examiner

*Primary Examiner*—David Nhu
(74) *Attorney, Agent, or Firm*—Finnegan, Henderson, Farabow, Garrett & Dunner, L.L.P.

(57) ABSTRACT

An apparatus for annealing a substrate includes a substrate stage having a substrate mounting portion configured to mount the substrate; a heat source having a plurality of heaters disposed under the substrate mounting portion, the heaters individually preheating a plurality areas defined laterally in the substrate through a bottom surface of the substrate; and a light source facing a top surface of the substrate, configured to irradiate a pulsed light at a pulse width of about 0.1 ms to about 100 ms on the entire top surface of the substrate.

16 Claims, 10 Drawing Sheets

APPARATUS FOR ANNEALING, METHOD FOR ANNEALING, AND METHOD FOR MANUFACTURING A SEMICONDUCTOR DEVICE

CROSS REFERENCE TO RELATED APPLICATIONS AND INCORPORATION BY REFERENCE

This application is based upon and claims the benefit of priority from prior Japanese Patent Application P2005-188209 filed on Jun. 28, 2005; the entire contents of which are incorporated by reference herein.

BACKGROUND OF THE INVENTION

1. Field of the Invention

The present invention relates to methods for annealing a substrate, and particularly to an apparatus and method for annealing a semiconductor substrate so as to manufacture semiconductor devices using a high intensity light source, and a manufacturing method of semiconductor devices using the annealing method.

2. Description of the Related Art

It is possible to achieve improvements in performance of a semiconductor device having a large scale integration (LSI) by increasing integration density, or to put it more plainly, by miniaturization of the elements that build up a semiconductor device. Thus, the degree of on-chip integration of LSIs are increasing larger and larger while miniaturization of elements, such as metal-oxide-semiconductor (MOS) transistors, is being taken to a whole new level. Along with the miniaturization of elements, parasitic resistance and short channel effects on MOS transistors and the like, are increasing. Thus, there is increased importance placed on the formation of low resistance layers and shallow pn junctions.

For forming a shallow pn junction with a thickness of or below twenty nm, impurity ions are implanted in a semiconductor substrate with low acceleration energy so as to establish a shallow projected range. The impurities doped in the semiconductor substrate are activated by annealing, thus forming a shallow impurity diffusion region. In order to decrease layer resistance of an impurity diffusion region, it is necessary to perform activation annealing of the impurities at a high temperature.

However, the diffusion coefficients of p-type impurity such as boron (B), and n-type impurity such as phosphorus (P) or arsenic (As), in the crystal of the silicon (Si) substrate, are large. In the processing time needed to perform rapid thermal annealing (RTA) using current halogen lamps, impurities diffuse to both the interior and exterior of a semiconductor substrate. As a result, it is impossible to form a shallow impurity diffusion region having a high concentration of impurities on the semiconductor substrate. Also, it becomes impossible to activate a high concentration of impurities if the temperature of the RTA process is decreased in order to control the diffusion of the impurities. Because of such difficulties, it is difficult to form a shallow impurity diffusion region having low resistance and a high concentration of activated impurities.

Recently, a pulse light annealing method by the use of a pulse light source, such as a flash lamp and a YAG laser, which can instantly supply the energy essential to impurity activation, is being tested as a solution to the RTA problem (refer to U.S. Pat. No. 4,151,008). A xenon (Xe) flash lamp has a quartz glass tube filled with Xe gas, in which electrical charges stored in capacitors and the like, are instantaneously discharged. As a result, it is possible to emit a high intensity white light within a range of several hundred µs to several hundred ms. It is possible to attain the heat energy required for impurity activation in the instantaneous heating of a semiconductor substrate absorbing flash lamplight. Therefore, it is possible to activate a high concentration of impurities while leaving the concentration profile of the impurities, implanted into the semiconductor substrate, virtually unchanged.

However, in using flash lamp annealing, irradiation energy above 20 $J/cm^2$ is essential to ensure a sufficiently uniform activation of impurities at a high concentration, which would lead to a sudden temperature increase on the semiconductor substrate. As a result, there occurs a temperature difference in between a top surface and a bottom surface of the semiconductor substrate, which raises the amount of thermal stress in the interior of the semiconductor substrate. Especially, a total amount of thermal stress generated in the semiconductor substrate having a larger area increases. Thermal stress causes crystal defects such as dislocations and slip. The presence of crystal defects makes it easy for damage to occur in the semiconductor substrate, leading to decreases in a manufacturing yield. Thus, it is difficult to perform annealing with flash lamp annealing processes while suppressing the generation of damage generated in the semiconductor substrate.

SUMMARY OF THE INVENTION

A first aspect of the present invention inheres in an apparatus for annealing a substrate including a substrate stage having a substrate mounting portion configured to mount the substrate; a heat source having a plurality of heaters disposed under the substrate mounting portion, the heaters individually preheating a plurality areas defined laterally in the substrate through a bottom surface of the substrate; and a light source facing a top surface of the substrate, configured to irradiate a pulsed light at a pulse width of about 0.1 ms to about 100 ms on the entire top surface of the substrate.

A second aspect of the present invention inheres in a method for annealing a substrate including individually preheating each of a plurality of areas defined laterally in the substrate; and irradiating an entire top surface of the substrate with a pulsed light at a pulse width of about 0.1 ms to about 100 ms, in synchronization with the preheating.

A third aspect of the present invention inheres in a method for manufacturing a semiconductor device including defining laterally a plurality of areas in a semiconductor substrate; treating the semiconductor substrate by a first manufacturing process including: individually preheating each of the areas; and irradiating an entire top surface of the semiconductor substrate with a pulsed light at a pulse width of about 0.1 ms to about 100 ms, in synchronization with the preheating; and treating the semiconductor substrate by a second manufacturing process.

DETAILED DESCRIPTION OF THE INVENTION

Figure 1:
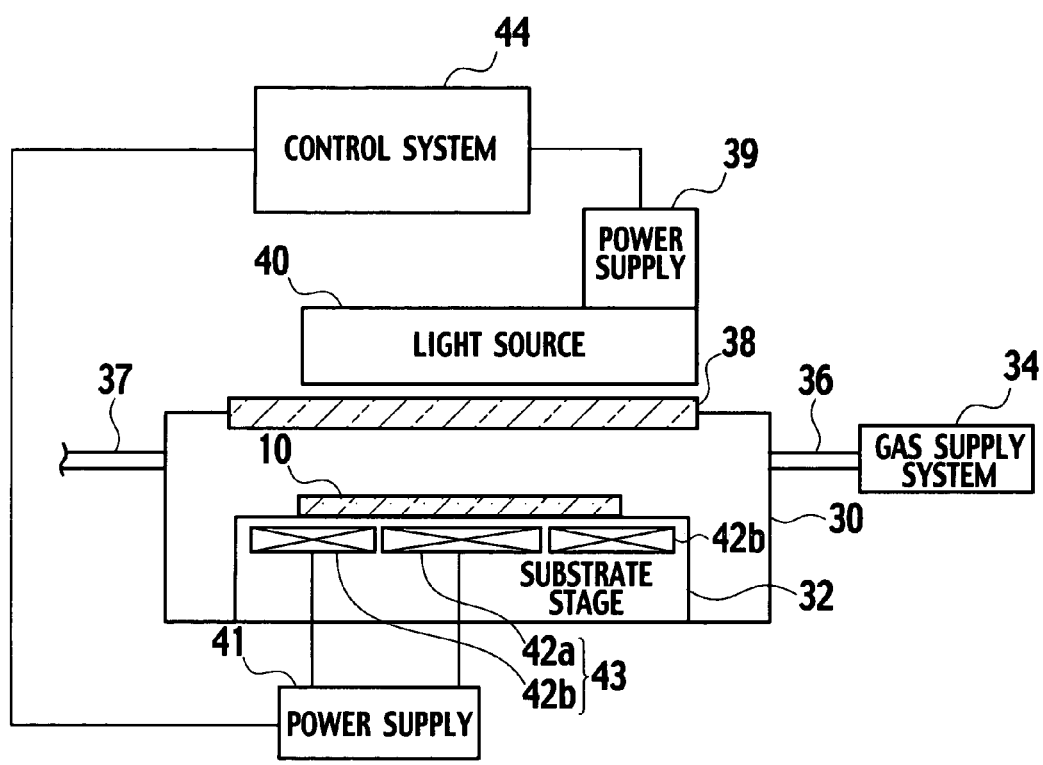
FIG. 1 is a schematic view showing an example of an annealing apparatus according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In an embodiment of the present invention, description will be given using an activation annealing process of the implanted impurity ions. For instance, P ions or As ions are used as n-type impurity ions, and B ions are used as p-type impurity ions. However, the annealing process according to the embodiment of the present invention is not limited to the activation annealing of the implanted impurity ions. It is obvious that annealing processes for applications such as an insulating film formation of an oxide film and a nitride film, and recrystallization of damaged layers and the like can be put into use.

As shown in FIG. 1, an annealing apparatus according to a first embodiment of the present invention includes a process chamber 30, a gas supply system 34, a light source 40, and a control system 44. Feeding piping 36 and exhaust piping 37 are provided on the process chamber 30. The feeding piping 36 is connected to the gas supply system 34. A transparent window 38 is disposed on top of the process chamber 30 and faces the light source 40. A substrate stage 32 having a substrate mounting portion, on top of which a semiconductor substrate 10 is mounted, is disposed facing the light source 40 on the bottom of the interior of the process chamber 30.

A heat source 43 used to preheat the semiconductor substrate 10 through the substrate stage 32 is provided in the substrate stage 32. The heat source 43 has a first heater 42a and a second heater 42b disposed under the substrate mounting portion of the substrate stage 32. The light source 40, the first and second heater of the heat sources 43 are connected to the control system 44 through power supplies 39 and 41, respectively.

The processing chamber 30, which is used to carry out annealing in order to activate implanted impurity ions in the semiconductor substrate 10, such as a Si substrate, is made of a metal such as stainless steel. Aluminum nitride (AlN), ceramics, quartz glass, and the like, may be used as the substrate stage 32. Also, the substrate stage 32 may be stainless steel with a surface protected by AlN, ceramics, or quartz glass. An embedded metallic heater such as a nichrome wire, a hot plate, a heating lamp such as a halogen lamp, and the like, are used for the heat source 43. Preheating temperature of the heat source 43 is controlled by the control system 44.

Figure 2:
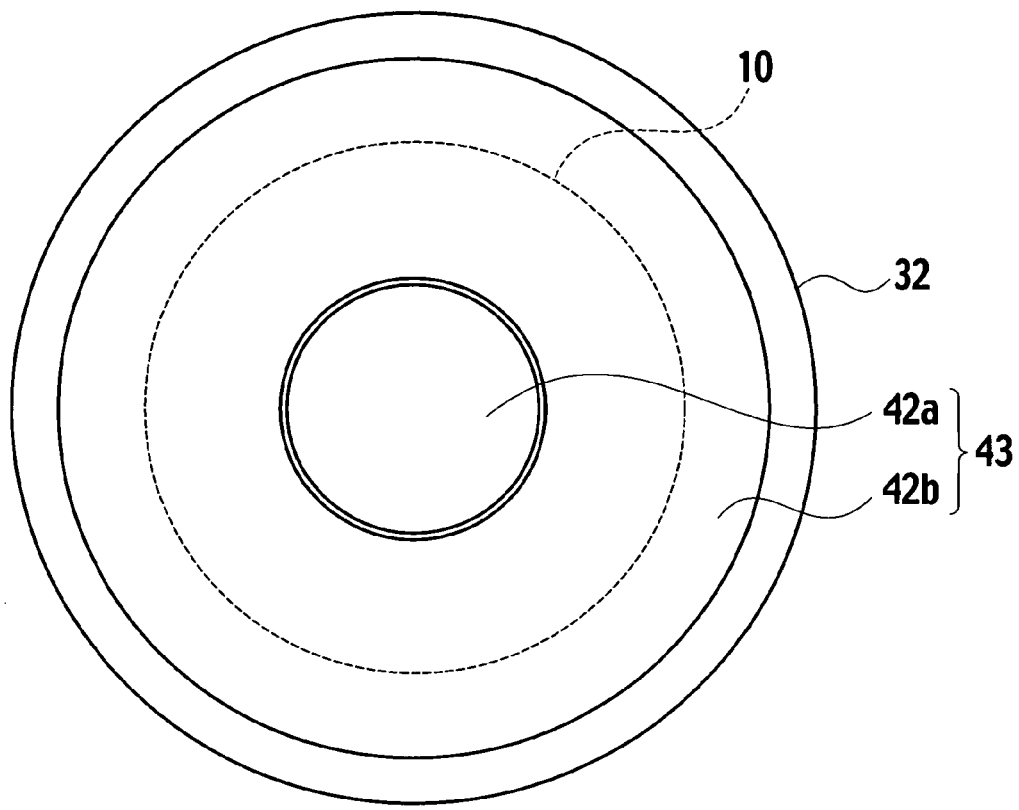
FIG. 2 is a schematic view showing an example of a heat source of the annealing apparatus according to the embodiment of the present invention.
Figure 3:
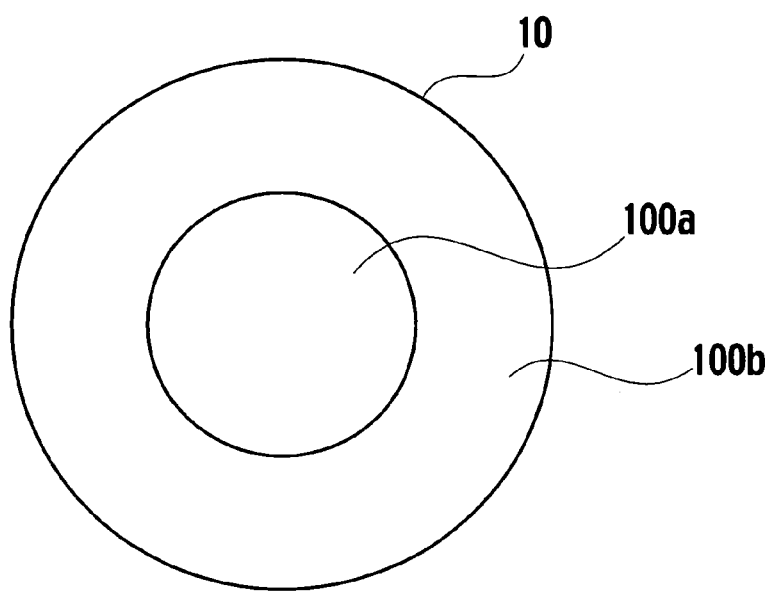
FIG. 3 is a schematic view showing an example of a preheating area by the heat source of the annealing apparatus according to the embodiment of the present invention.

As shown in FIGS. 1 and 2, the first heater 42a of the heat source 43 is provided so as to face a central part on a bottom surface of the semiconductor substrate 10 placed on the substrate stage 32. The second heater 42b is provided outside the first heater 42a so as to face a peripheral part including an edge of the semiconductor substrate 10. As shown in FIG. 3, the first and second heaters 42a, 42b are used to individually preheat a first area 100a which is assigned at the central part of the semiconductor substrate 10, and a second area 100b which is assigned outside the first area 100a to include the edge of the semiconductor substrate 10, through the substrate stage 32.

During the annealing of the semiconductor substrate 10, an inert gas, such as nitrogen ($N_2$) and argon (Ar), is fed from the gas supply system 34 through the feeding piping 36 into the process chamber 30. The inert gas fed into the process chamber 30 is exhausted through the exhaust piping 37.

The light source 40, such as a flashlamp, irradiates a pulsed light through the transparent window 38 made of synthetic quarts and the like, onto the top surface of the semiconductor substrate 10, to heat the semiconductor substrate 10. The power supply 39, such as a pulse power supply, drives the light source 40 at an extremely short pulse width. The full width at half maximum (FWHM) of the pulse is about 0.1 ms to about 100 ms. The power supply 39 is controlled by the control system 44 to regulate the irradiation energy and pulse width of the light beamed from the light source 40. The energy density of the light from the light source 40 is within a range of about 15 $J/cm^2$ to about 40 $J/cm^2$, desirably within a range of about 20 $J/cm^2$ to about 34 $J/cm^2$. The transparent window 38 transmits the light from the light source 40 to the semiconductor substrate 10 while maintaining an airtight barrier separating the processing chamber 30 from the light source 40.

Figure 4:
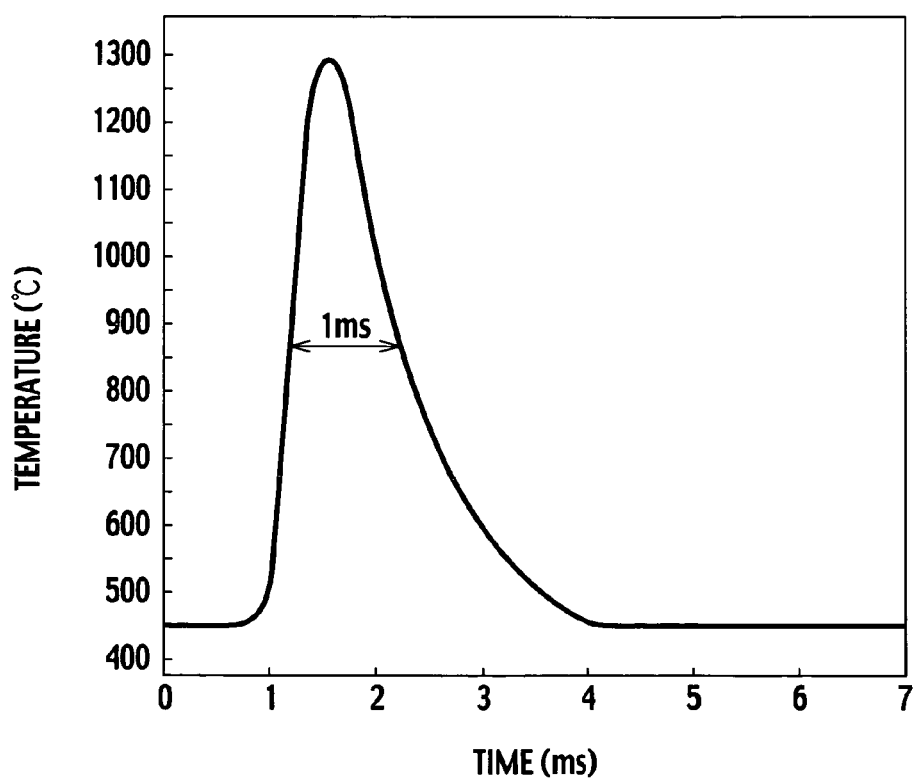
FIG. 4 is a diagram showing an example of a heating property of the light source of the annealing apparatus according to the embodiment of the present invention.

As shown in FIG. 4, at a peak temperature of about 1300° C. for example, which is the highest temperature reached by the heating provided by the Xe flashlamp used as the light source 40, a thermal profile having a FWHM of about one ms can be attained. In the Xe flashlamp, it is possible to achieve precipitous increases and decreases in temperature compared to an infrared lamp, such as a halogen lamp, used in RTA. The thermal elevation time for an increase or a decrease of temperature between about 450° C. and about 1300° C. is more than about ten seconds, for example about 15 seconds with the halogen lamp light. Additionally, a thermal elevation time of about two seconds to about three seconds is required for the increase or the decrease of temperature between about 900° C. and about 1300° C. On the other hand, with the flashlamp light, the thermal elevation time required for a temperature between about 450° C. and about 1300° C. is between about 0.1 ms and about 100 ms, and desirably between about 0.5 ms to about 50 ms. Here, the surface temperature of the semiconductor substrate 10 is measured by a high-speed pyrometer.

On the annealing process used to activate implanted impurity ions, since the highest temperature reached with a thermal elevation time less than about 0.1 ms is less than about 900°

C., the implanted impurity ions in the semiconductor substrate 10 may not be sufficiently activated. If the thermal elevation time exceeds about 100 ms, the highest temperature reached may exceed about 1400° C. If the semiconductor substrate 10 is heated exceeding about 1400° C., the diffusion of the implanted impurities is enhanced. As a result, it becomes difficult to form a shallow pn junction near the surface of the semiconductor substrate 1 because of the diffusion of the impurities implanted into the semiconductor substrate 10.

In activation annealing, the semiconductor substrate 10, placed on top of the substrate stage 32, is preheated by the heat source 43 within a temperature range of about 300° C. to about 600° C., and desirably a temperature range of about 400° C. to about 500° C. A desirable preheating time would be in a range of about ten seconds to 120 seconds. The preheating is set to a temperature and a time that may not cause damages to the semiconductor substrate 10. If a preheating temperature is less than about 300° C., there are cases in which the highest reached temperature will only be 900° C. or less. Further, if the preheating temperature exceeds about 600° C., there are cases in which the highest reached temperature will exceed about 1400° C.

In the annealing apparatus according to the first embodiment, the thermal elevation time for a temperature between 450° C. and 1300° C. is about four milliseconds, as shown in FIG. 4. The thermal elevation time for a temperature between about 900° C. and about 1300° C. is about one millisecond. According to the first embodiment, it is possible to carry out activation annealing of impurities implanted to the semiconductor substrate 10 at a temperature of about 900° C. or more in an extremely short period of time. As a result, impurity diffusion arising from activation annealing can be limited to a depth of about five nanometers or less. Thus, it is possible to form a shallow pn junction.

Figure 5:
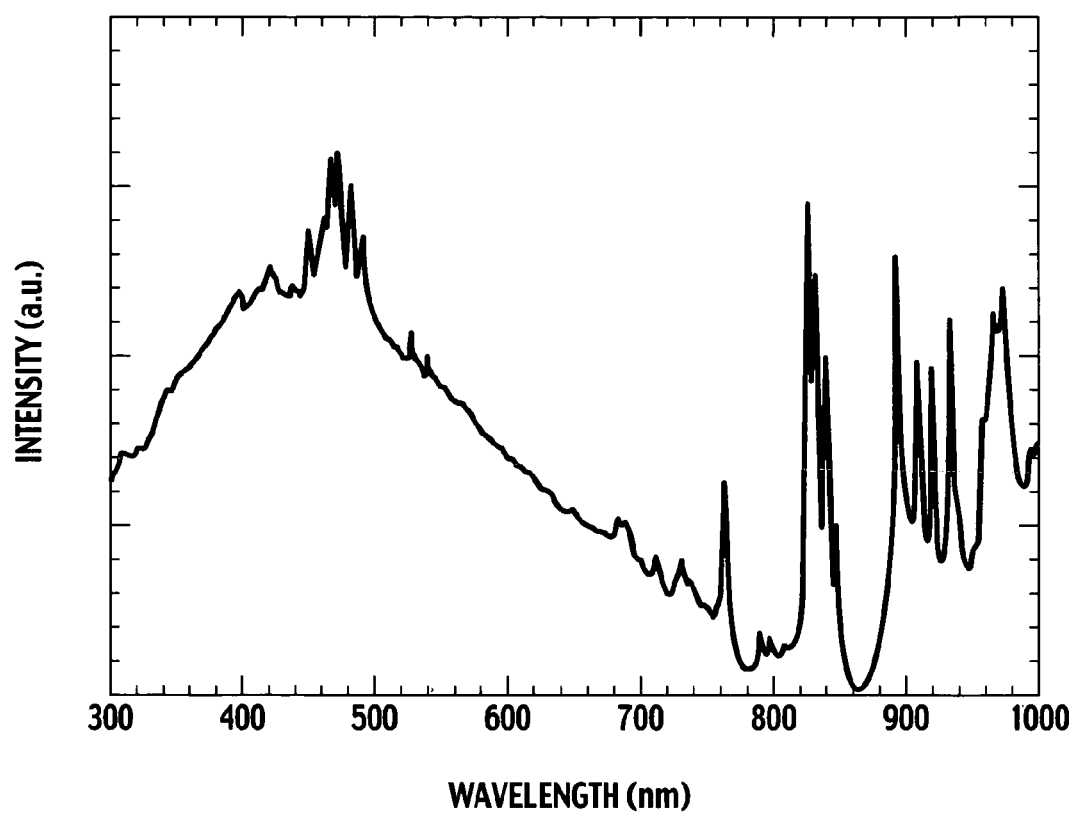
FIG. 5 is a diagram showing an example of a spectrum of the light source of the annealing apparatus according to the embodiment of the present invention.

However, at a temperature of about 900° C. or more and an extremely short thermal elevation cycle, crystal defects, such as dislocations and slip, that are caused by thermal stress become easily generated in the semiconductor substrate 10. Further, the luminous spectrum of the Xe flashlamp of the light source 40 is close to that of white light, and has a main peak intensity wavelength from about 400 nm to about 500 nm, as shown in FIG. 5.

Light in a peak intensity wavelength range below about one micrometer of the flashlamp is mainly absorbed in a region ranging from the surface of the semiconductor substrate 10 to a depth of about 0.1 micrometers. Rapid temperature increases locally occur in the region ranging from the surface of the semiconductor substrate 10 to a depth of several tens micrometers. As a result of the rapid temperature increases, a thermal difference of between about 300° C. and about 1000° C. occurs between the top and bottom surfaces of the semiconductor substrate 10. The thermal difference causes an increase in the thermal stress in the interior of the semiconductor substrate 10. Because of the crystal defects due to the thermal stress in the interior of semiconductor substrate 10, the semiconductor substrate 10 will suffer damage. Thus, because of the damage caused by thermal stress, cracking resistance of the semiconductor substrate 1 is insufficient in the extremely short heating provided by the light source 40.

In the annealing apparatus according to the embodiment of the present invention, the heat source 43 having the first and second heaters 42a, 42b which are used to individually preheat each of the first and second areas 100a, 100b defined laterally in the semiconductor substrate 10 through the substrate stage 32, as shown in FIG. 1. "The lateral direction" is defined in a plane parallel to the top and bottom surfaces of the semiconductor substrate 10. The flashlamp light beamed from the light source 40 is irradiated on the entire top surface of the semiconductor substrate 10 in synchronization with the timing of the preheating against the first and second areas 100a, 100b, respectively.

For example, when the first area 100a of the semiconductor substrate 10 is selectively preheated by the first heater 42a, the second area 100b is not preheated. Therefore, when irradiating the top surface of the semiconductor substrate 10 with the flashlamp light for activation annealing of the first area 100a, the second area 100b, which is not preheated, is not heated to a high temperature required for activation annealing. Similarly, when the second area 100b is selectively preheated by the first heater 42b, the first area 100a is not preheated. Therefore, when irradiating the top surface of the semiconductor substrate 10 with the flashlamp light for activation annealing of the second area 100b, the first area 100a, which is not preheated, is not heated to a high temperature required for activation annealing.

Thus, in the annealing apparatus according to the embodiment of the present invention, activation annealing may be carried out while individually preheating each of the first and second areas 100a, 100b of the semiconductor substrate 10. As a result, a total amount of thermal stress in the interior of the semiconductor substrate 10 may be decreased. Thus, it is possible to carry out activation annealing to suppress damages generated in the semiconductor substrate 10.

Figure 6:
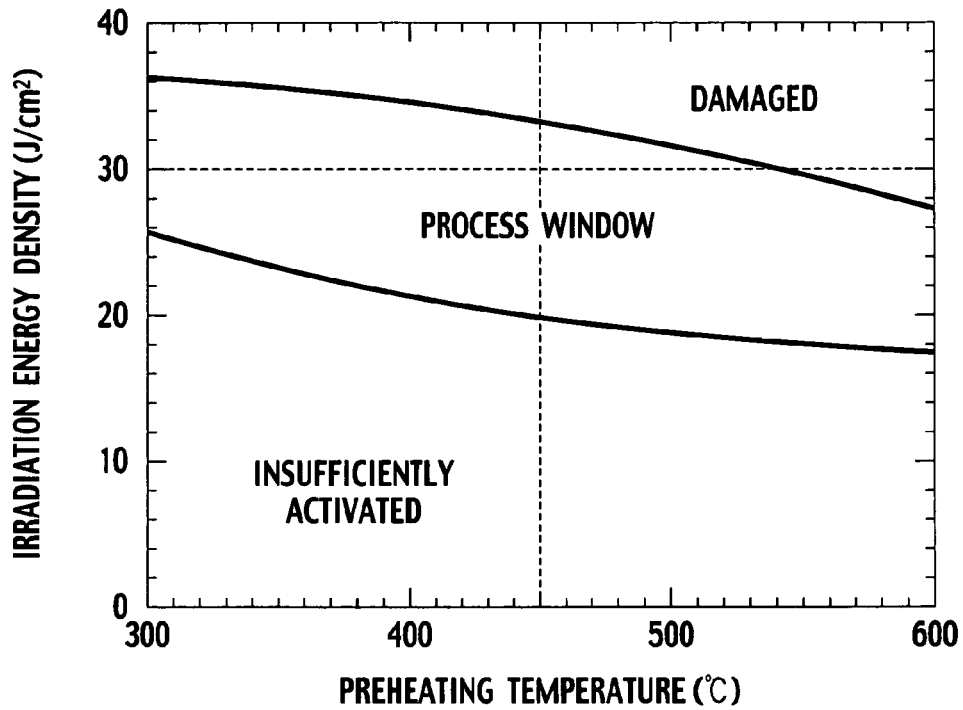
FIG. 6 is a diagram showing an example of a process window of a preheating temperature and an irradiation energy density of an annealing apparatus according to the embodiment of the present invention.

As shown in FIG. 6, in activation annealing of the implanted impurities using the annealing apparatus according to the embodiment of the present invention, in order to suppress damages and achieve a desirable activation rate, a process window of the irradiation energy density of flash lamp light depending on a preheating temperature of the semiconductor substrate 10 is provided. The preheating temperature may be measured at the first and second areas 100a, 100b individually preheated by the first and second heaters 42a, 42b.

When the irradiation energy density is less than the lower limit of the process window, the activation of the impurities may be insufficient, making it impossible to form a low resistance layer. If the irradiation energy density is more than the upper limit of the process window, damages will occur on the semiconductor substrate 10. For instance, regarding the preheating temperatures of about 600° C. and about 300° C. for the semiconductor substrate 10, the process windows of the irradiation energy density of flash lamp light are provided at about 18 J/cm$^2$ to about 27 J/Cm$^2$ and about 26 J/cm$^2$ to about 36 J/Cm$^2$, respectively. The process window of the irradiation energy density is provided at about 20 J/cm$^2$ to about 34 J/cm$^2$ at a preheating temperature of about 450° C.

As a comparative example, activation annealing is carried out by preheating the entire area of the semiconductor substrate 10 with the heat source 43 of the annealing apparatus shown in FIG. 1. On the comparative example, the entire top surface of the semiconductor substrate 10 is simultaneously heated to an activation annealing temperature with the flashlamp light. For example, the surface layer of the semiconductor substrate 10 is heated to about 1300° C. while preheating the entire area of the Si semiconductor substrate 10 having a diameter of about 200 mm. Since the thermal expansion coefficient of Si crystal is about $3.55 \times 10^{-6}$ K$^{-1}$, Si crystal of the heated surface layer expands with about one milimeter in a direction parallel to the surface of the semiconductor substrate 10. Thus, when preheating the entire area of the semiconductor substrate 10 without defining heating areas of the semiconductor substrate 10, thermal expansion of the semiconductor substrate 10 increases so that thermal stress may be increased over the critical point for brittle fracture of the Si crystal. As a result, the semiconductor substrate 10 may be damaged by thermal stress.

Figure 7:
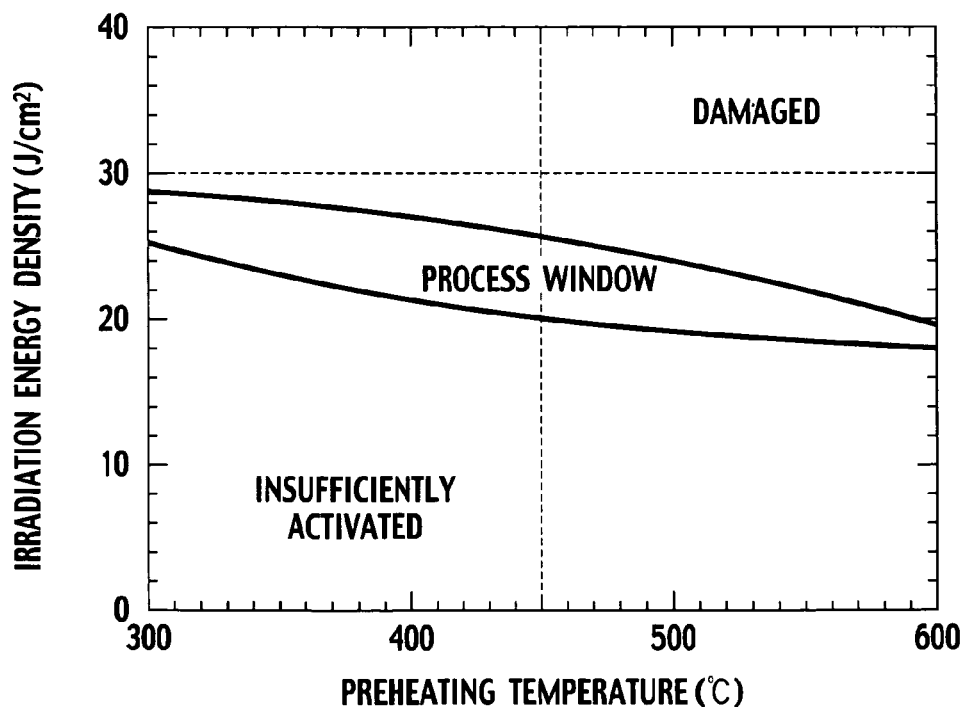
FIG. 7 is a diagram showing an example of a process window of a preheating temperature and an irradiation energy density of an annealing apparatus according to a comparative example.

In the comparative example, the lower limit of the process window is roughly the identical to the lower limit of the process window according to the embodiment of the present invention, as shown in FIG. 7. However, compared to the upper limit of the process window according to the embodiment of the present invention, the irradiation energy density of the upper limit of the process window of the comparative example is decreased by more than about 7 J/cm². Thus, the process window of the comparative example shrinks to less than about ½.

In the annealing apparatus according to the embodiment of the present invention, the preheating areas of the semiconductor substrate 10 is defined by the first and second heaters 42a, 42b. For example, a diameter of the first area 100a of the semiconductor substrate 10 may be about 100 mm. In activation annealing of the first or second area 100a, 100b, the thermal expansion of the Si crystal can be suppress to about 0.5 mm. As a result, thermal stress in the interior of the semiconductor substrate 10 may be decreased. Therefore, damages generated in the semiconductor substrate 10 are suppressed and the cracking resistance of the semiconductor substrate 10 is improved. In the annealing apparatus according to the embodiment of the present invention, the process window is expanded, as shown in FIG. 6. Thus, it is possible to prevent a damage of the semiconductor substrate 10 and to stably form a low resistance layer.

Figure 8:
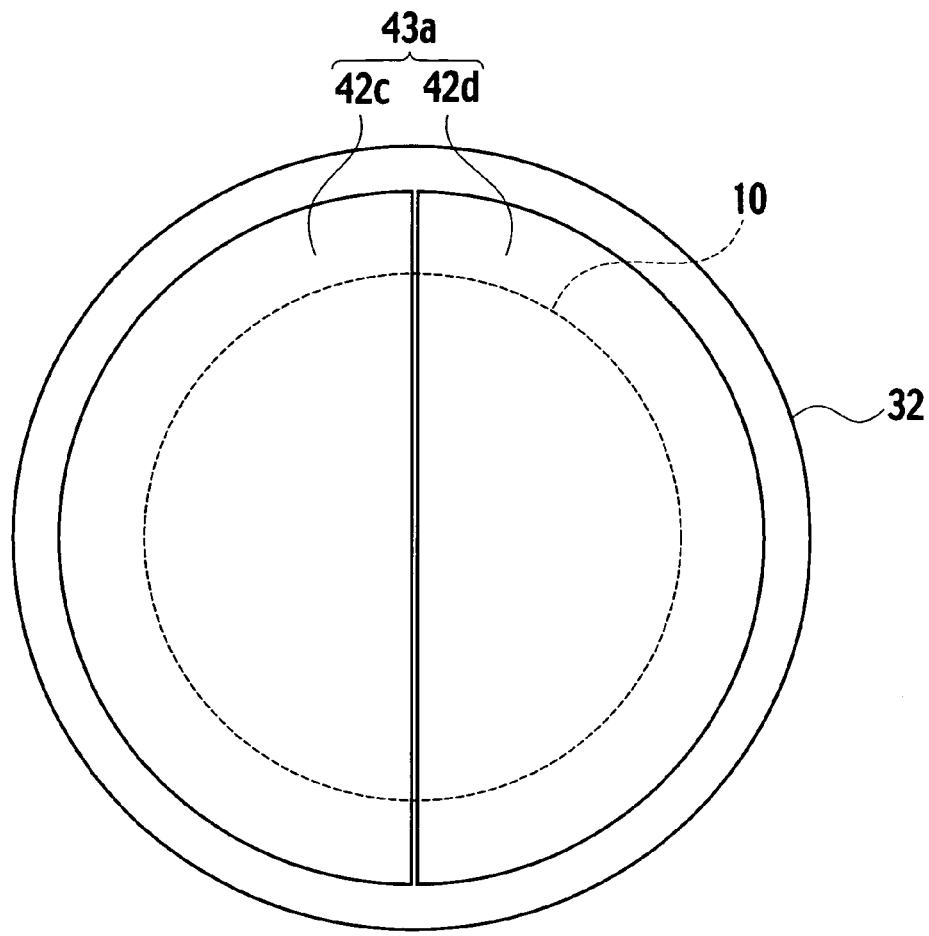
FIG. 8 is a schematic view showing another example of a heat source of the annealing apparatus according to the embodiment of the present invention.
Figure 9:
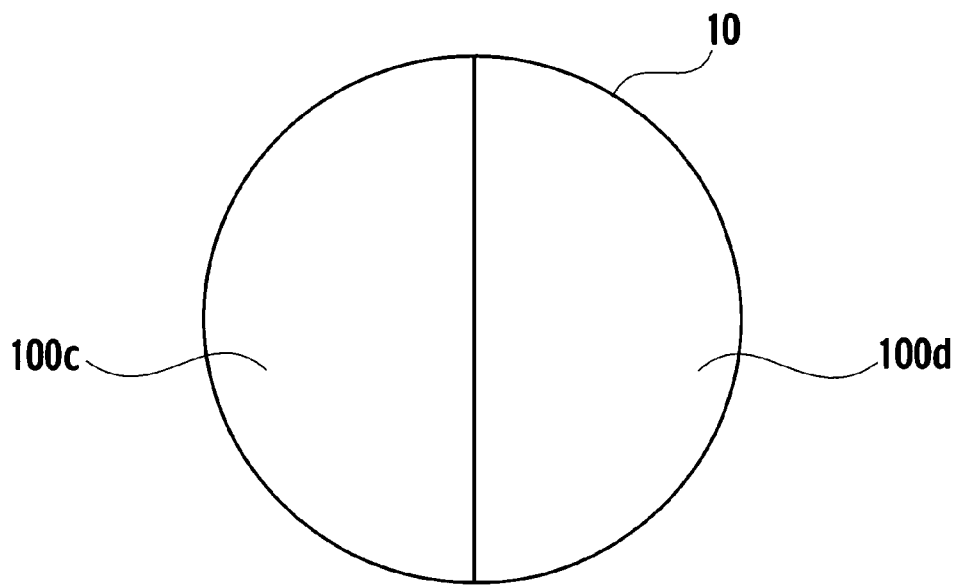
FIG. 9 is a schematic view showing another example of a preheating area by the heat source of the annealing apparatus according to the embodiment of the present invention.

In addition, in the annealing apparatus according to the embodiment of the present invention, the heat source 43 having the circular first heater 42a and the annular second heater 42b is used, as shown in FIG. 2. However, the shape of the heat source is not limited. As shown in FIG. 8, a heat source 43a divided into first and second semicircular heaters 42c, 42d may be used. As shown in FIG. 9, semicircular first and second areas 100c, 100d which are allocated in a mirror symmetry with respect to a diameter of the semiconductor substrate 10, are individually preheated by the first and second heaters 42c, 42d. Each of the semicircular first and second areas 100c, 100d corresponds to either half of a circular area of the semiconductor substrate 10 divided diametrically. Therefore, it is possible to reduce thermal stress due to activation annealing in the interior of the semiconductor substrate 10.

Figure 10:
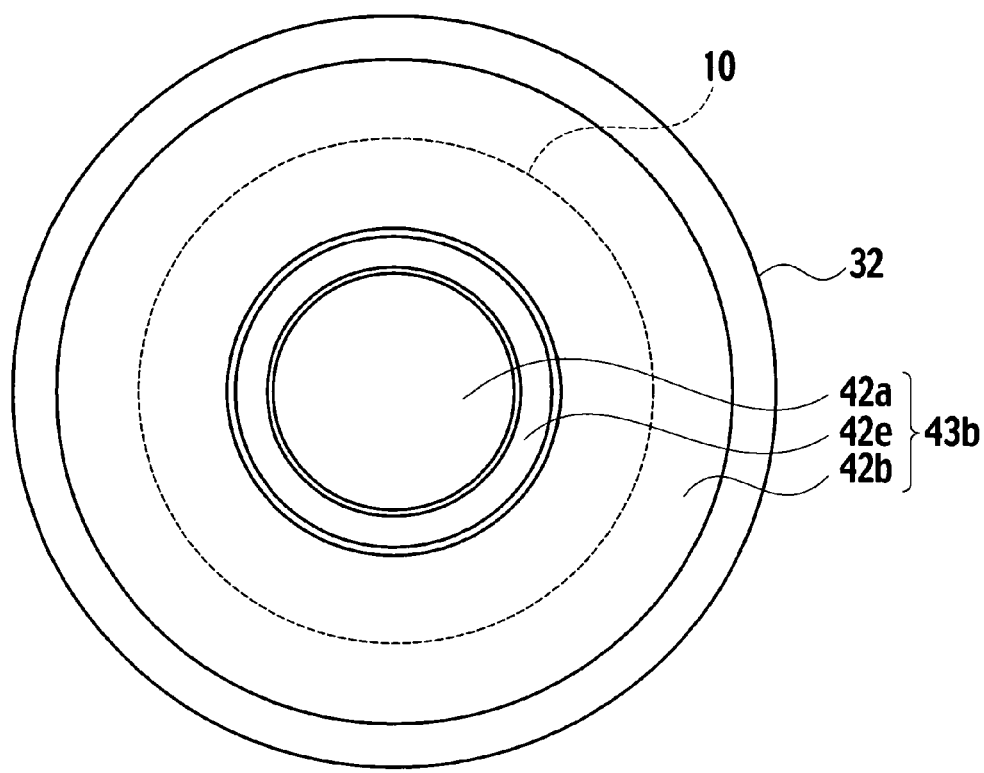
FIG. 10 is a schematic view showing another example of a heat source of the annealing apparatus according to the embodiment of the present invention.
Figure 11:
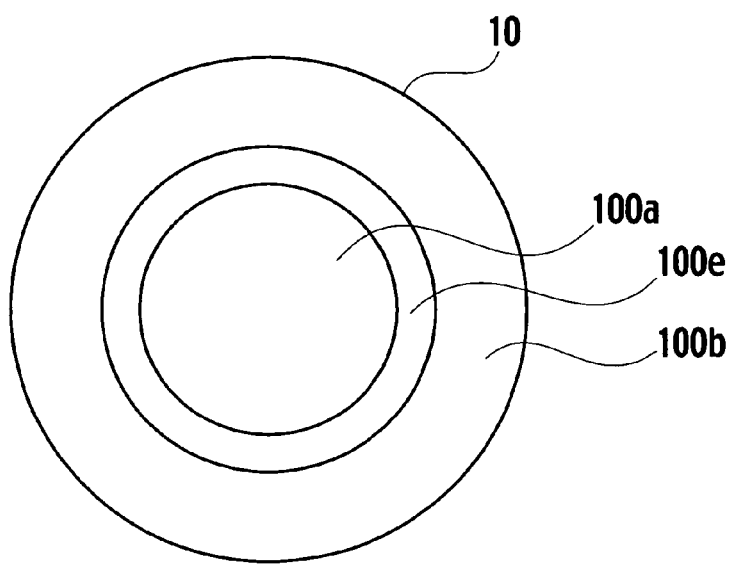
FIG. 11 is a schematic view showing another example of a preheating area by the heat source of the annealing apparatus according to the embodiment of the present invention.

Further, in the annealing apparatus according to the embodiment of the present invention, the heat source 43 divided in two is used. However, a heat source having a plurality of heaters more than three may be used. As shown in FIG. 10, a heat source 43b having a third heater 42e between the first and second heaters 42a, 42b may be used. As shown in FIG. 11, the third heater 42e is used to selectively preheat a third area 100e between the first and second areas 100a, 100b of the semiconductor substrate 10.

When individually preheating by each of the first and second heaters 42a, 42b of the heat source 43, an area exceeding a border of the first and second areas 100a, 100b of the semiconductor substrate 10 is preheated by a diffusion of heat. As a result, in activation annealing for each of the first and second areas 100a, 100b, an activated impurity concentration may be increased around the border of the first and second areas 100a, 100b. For example, when preheating by each of the first and second heaters 42a, 42b using the heat source 43b, preheating by the third heater 42e is simultaneously carried out. By lowering a preheating temperature of the third heater 42e compared to the respective first and second heaters 42a, 42b, it is possible to achieve a uniform activated impurity concentration distribution.

Next, an annealing method and a semiconductor manufacturing method according to the embodiment of the present invention will be described using a manufacturing process of a complementary MOS (CMOS) transistor as an example. Further, the semiconductor device is not limited to a p-MOS transistor. A semiconductor device, such as a n-MOS transistor and a p-MOS transistor, are also within the scope of the invention. Additionally, a metal-insulator-semiconductor (MIS) transistor using an insulating film, such as a silicon oxynitride (SiON) film, a silicon nitride ($Si_3N_4$) film, or a composite insulating film between a silicon oxide ($SiO_2$) film and a SiON film, a $Si_3N_4$ film, a various metal oxide film and the like, instead of the $SiO_2$ film, is also within the scope of the invention.

Figure 12:
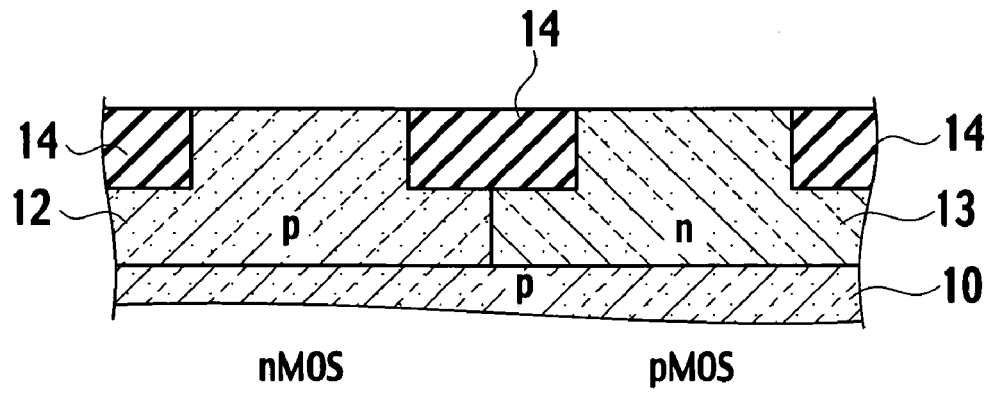
FIGS. 12 to 18 are cross section views showing an example of a manufacturing process of a semiconductor device used in a description of an annealing method according to the embodiment of the present invention.

As shown in FIG. 12, a p-well 12 is formed in a nMOS region of the p-type Si semiconductor substrate 10, and a n-well 13 is formed in a pMOS region. An shallow trench isolation (STI) 14 as an isolation region is formed around the p-well 12 and the n-well 13 by photolithography, reactive ion etching (RIE), chemical vapor deposition (CVD), and the like. The nMOS and PMOS regions, which serve as element regions, are separated by the STI 14.

Figure 13:
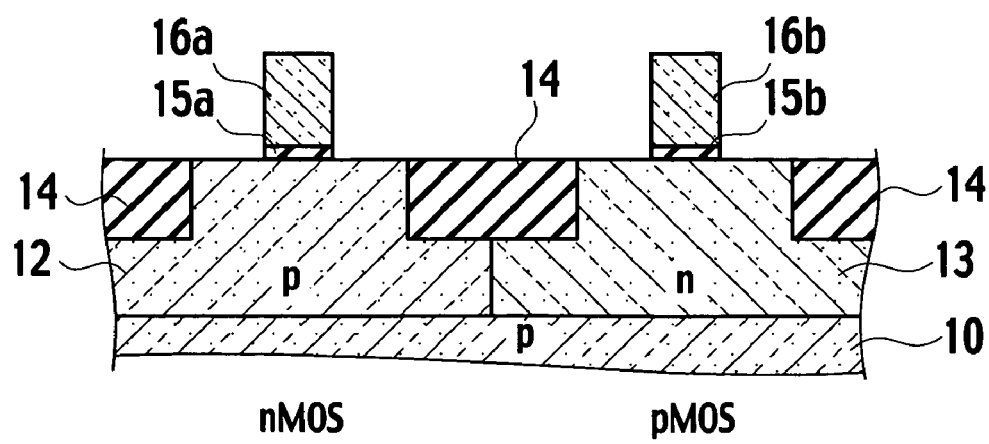

As shown in FIG. 13, an insulating film such as a thermally oxidized film is formed on the surfaces of the element regions of the semiconductor substrate 10. A polycrystalline Si (poly-Si) film is deposited on top of the insulating film by low pressure (LP) CVD and the like. By photolithography, RIE and the like, the poly-Si film and the insulating film are selectively removed, so as to form gate electrodes 16a, 16b and gate insulating films 15a, 15b in the p-well 12 and the n-well 13, respectively.

Figure 14:
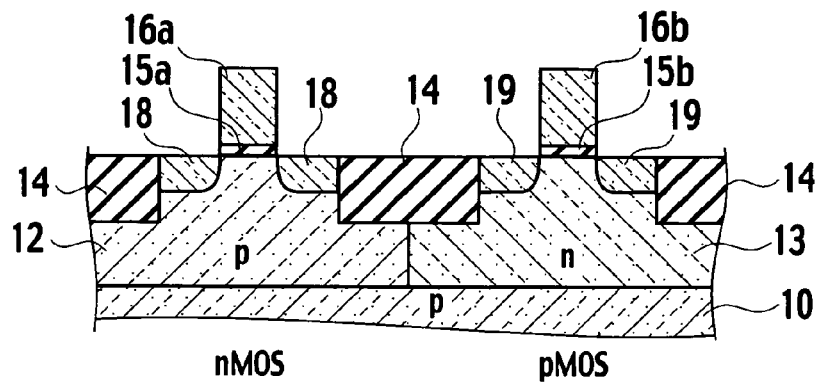

In an ion implantation process (a first manufacturing process), by photolithography and the like, a photoresist film is formed to cover the pMOS region. Using the resist film and the gate electrode 16a as a mask, group V element ions, such as As ions, as the n-type impurities are selectively implanted into the nMOS region by ion implantation. The photoresist film on the PMOS region is removed by a resist stripper and the like. By photolithography and the like, a photoresist film is formed to cover the nMOS region. Using the resist film and the gate electrode 16b as a mask, group III element ions, such as B ions, as the p-type impurities are selectively implanted into the pMOS region by ion implantation. The photoresist film on the pMOS region is removed by a resist stripper and the like. As a result, impurity implanted regions 18 between both ends of the gate insulating film 15a and the STI 14, and impurity implanted regions 19 between both ends of the gate insulating film 15b and the STI 14 are formed, respectively, as shown in FIG. 14.

As ion implantation conditions are an acceleration energy of about 2 keV and an implant dose of about $1 \times 10^{15}$ cm$^{-2}$. B ion implantation conditions are an acceleration energy of about 0.5 keV and an implant dose of about $1 \times 10^{15}$ cm$^2$. Each depth of the impurity implanted regions 18, 19 is about 15 nm from each surface of the p-well 12 and the n-well 13.

Figure 15:
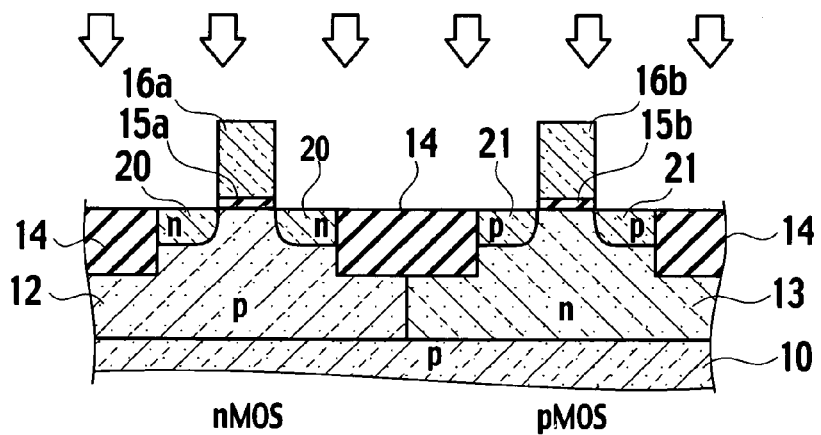

The semiconductor substrate 10 is placed on top of the substrate stage 32 of the annealing apparatus shown in FIG. 1. As shown in FIG. 15, the semiconductor substrate 10 is preheated to about 450° C. from the bottom surface of the semiconductor substrate 10 by the first heater 42a of the heat source 43 through the substrate stage 32. The entire surface of the semiconductor substrate 10 is irradiated with flash lamp light from the light source 40 under conditions of a pulse width of about one ms and irradiation energy density of about 30 J/cm², while maintaining the pre-heating temperature of about 450° C. on the first area 100a shown in FIG. 3. The first heater 42a is turned off. Then, the semiconductor substrate 10 is preheated to about 450° C. from the bottom surface of the semiconductor substrate 10 by the second heater 42b. The entire surface of the semiconductor substrate 10 is irradiated with flash lamp light from the light source 40 under conditions of a pulse width of about one ms and irradiation energy density of about 30 J/cm$^2$, while maintaining the pre-heating temperature of about 450° C. on the second area 100b. The second heater 42b is turned off.

By activation annealing, the As and B ions implanted into the impurity implanted regions 18, 19 diffuse to a location in substitutional lattice sites to be activated. As a result, n-type extension regions 20 and p-type extension regions 21 are formed between both ends of the gate insulating films 5a, 5b and the STI 14, respectively.

Figure 16:
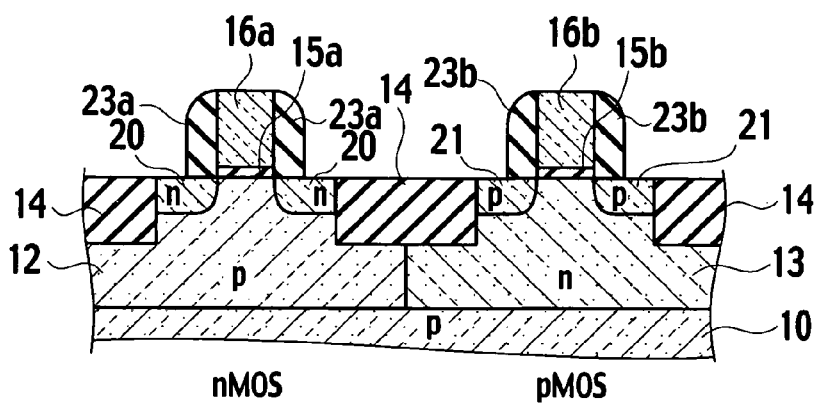

In a sidewall spacer formation process (a second manufacturing process), a multi-layered insulating film including $SiO_2$ and $Si_3N_4$, is deposited on the semiconductor substrate 10 by LPCVD and the like. The insulating film is selectively removed by directional etching, such as RIE and the like. As a result, the insulating film is selectively remained on side surfaces of the gate electrodes 16a, 16b, and the gate insulating films 15a, 15b. As shown in FIG. 16, multi-layered sidewall spacers 23a and 23b including $SiO_2$ and $Si_3N_4$ are formed, respectively.

In an ion implantation process (a first manufacturing process), by photolithography and the like, a photoresist film is formed to cover the pMOS region. Using the resist film, the gate electrode 16a and the sidewall spacer 23a as a mask, group V element ions, such as P ions, as the n-type impurities are selectively implanted into the nMOS region by ion implantation. The photoresist film on the PMOS region is removed by a resist stripper and the like. By photolithography and the like, a photoresist film is formed to cover the NMOS region. Using the resist film, the gate electrode 16b and the sidewall spacer 23b as a mask, group III element ions, such as B ions, as the p-type impurities are selectively implanted into the PMOS region by ion implantation. The photoresist film on the PMOS region is removed by a resist stripper and the like. P ion implantation conditions are an acceleration energy of about 10 keV and an implant dose of about $3 \times 10^{15}$ cm$^{-2}$. B ion implantation conditions are an acceleration energy of about 4 keV and an implant dose of about $3 \times 10^{15}$ cm$^{-2}$.

Figure 17:
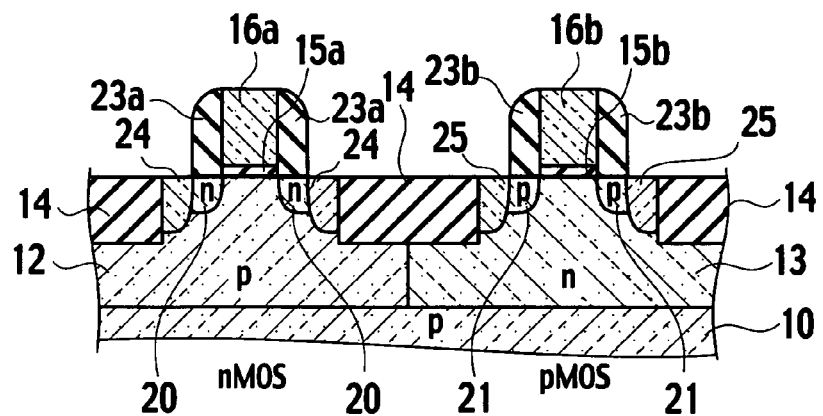
Figure 18:
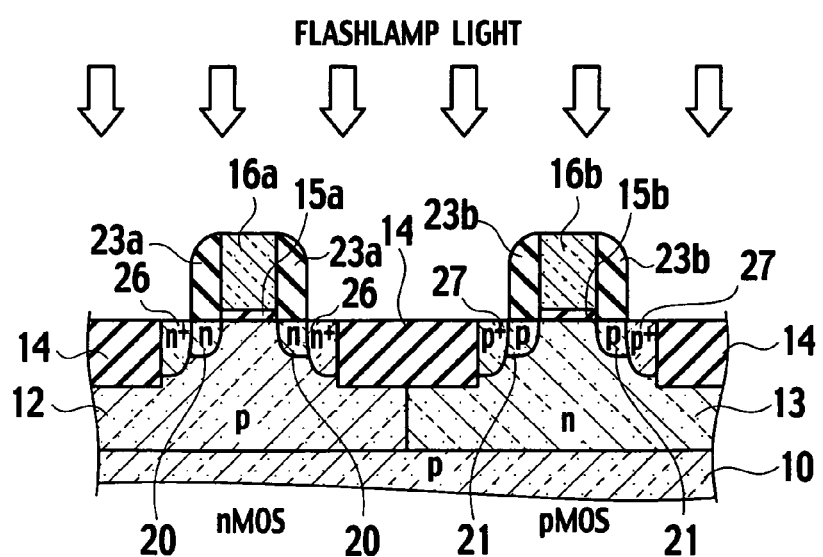

As a result, as shown in FIG. 17, impurity implanted regions 24 and 25 implanted with P and B ions are formed in the nMOS and PMOS regions of the semiconductor substrate 10 between both ends of the sidewall spacers 23a, 23b and the STI 14 at a depth deeper than the extension regions 20, 21, respectively. Additionally, the P and B ions are also implanted into the gate electrodes 16a, 16b in the nMOS and PMOS regions.

The semiconductor substrate 10 is placed on top of the substrate stage 32 of the annealing apparatus shown in FIG. 1. The semiconductor substrate 10 is preheated from the bottom surface of the semiconductor substrate 10 to about 450° C., by the first heater 42a of the heat source 43. While maintaining a preheating temperature of about 450° C. on the first area 100a shown in FIG. 3, the entire surface of the semiconductor substrate 10 is irradiated with flash lamp light from the light source 40 with a pulse width of about one ms and irradiation energy density of about 30 J/cm$^2$. The first heater 42a is turned off. Then, the semiconductor substrate 10 is preheated from the bottom surface of the semiconductor substrate 10 to about 450° C., by the first heater 42b of the heat source 43. While maintaining a preheating temperature of about 450° C. on the first area 100b, the entire surface of the semiconductor substrate 10 is irradiated with flash lamp light from the light source 40 with a pulse width of about one ms and irradiation energy density of about 30 J/cm$^2$. The second heater 42b is turned off. As a result, n+ type source-drain regions 26 are formed between both ends of the sidewall spacer 23a and the STI 14, abutting the extension regions 20, as shown in FIG. 17. Similarly, p+ type source-drain regions 27 are formed between both ends of the sidewall spacer 23b and the STI 14, abutting the extension regions 21.

In an interlevel insulating film formation process (a second manufacturing process), an interlevel insulating film such as $SiO_2$, is deposited on the surface of the semiconductor substrate 10 by CVD and the like. Contact holes are opened in the interlevel insulating film above the gate electrodes 16a, 16b, and the source-drain regions 26, 27, respectively. Interconnections are connected to the gate electrodes 16a, 16b, the source-drain regions 26, 27 through the contact holes, respectively. Thus, a semiconductor device is manufactured.

In the annealing method according to the embodiment of the present invention, the impurities implanted to the impurity implanted regions 18, 19 formed in the ion implantation process are activated with an irradiation energy density that is sufficient enough to achieve a desired activation rate. Additionally, in the activation annealing, preheating by each of the first and second heaters 42a, 42b is limited to each of the first and second areas 100a, 100b. For example, a diameter of the first area 100a of the semiconductor substrate 10 may be about 100 mm. In activation annealing of the first or second area 100a, 100b, thermal stress in the interior of the semiconductor substrate 10 may be decreased. Therefore, it is possible to suppress damages generated in the semiconductor substrate 10 and to form a shallow pn junction. Thus, according to the embodiment of the present invention, it is possible to improve a cracking resistance of the semiconductor substrate 10 while manufacturing a semiconductor device at a high yield.

In the above-mentioned description, the preheating temperature of each of the first and second areas 100a, 100b is about 450° C. However, different preheating temperatures for the respective first and second areas 100a, 100b may be used. For example, preheating conditions may be adjusted based on an in-plane distribution property of measured sheet resistance.

Generally, in the vicinity of the edge of the semiconductor substrate 10, heat is easily lost and heating efficiency decreases. For example, preheating temperature of the second area 100b, which is located in a edge side of the semiconductor substrate 10, is increased by about 20° C. compared to the first area 100a, which is located in a central part of the semiconductor substrate 10. As a result, the standard deviation σ of the in-plane distribution of the semiconductor substrate 10 of sheet resistance is decreased to about 1%. Thus, in the embodiment of the present invention, since it is possible to adjust the preheating temperature for each of the first and second areas 100a, 100b as needed, it becomes possible to improve in-plane uniformity of the annealing temperature. Therefore, it is possible to suppress variations of the electrical properties of a semiconductor device, and to improve the production yield on an annealing process.

Other Embodiments

In the description of the embodiment of the present invention, a Xe flash lamp is used as the light source 40 shown in FIG. 1. However, the light source 40 is not limited to a Xe flash lamp. It is also possible to use a light source that can emit a high intensity light, such as a flash lamp using gasses such as other noble gas, mercury, and hydrogen, a Xe arch discharge lamp, and a laser including an excimer laser, a YAG laser, a carbon monoxide (CO) gas laser, a carbon dioxide ($CO_2$) gas laser, and the like, as the light source 40.

Further, the semiconductor substrate 10 is used as a substrate. However, the substrate is not limited to the semiconductor substrate 10. It is also possible to use a substrate, such as a ceramic substrate, an insulating substrate, a silicon-on insulator (SOI) substrate, and the like, as the substrate.

Various modifications will become possible for those skilled in the art after storing the teachings of the present disclosure without departing from the scope thereof.

What is claimed is:

1. A method for annealing a substrate, comprising:
   individually preheating each of a plurality of areas defined laterally in the substrate; and
   irradiating an entire top surface of the substrate with a pulsed light at a pulse width of about 0.1 ms to about 100 ms, in synchronization with the preheating;
   wherein the areas include a first area assigned at a central part of the substrate and a second area outside the first area including an edge of the substrate.

2. A method for annealing a substrate, comprising:
   individually preheating each of a plurality of areas defined laterally in the substrate; and
   irradiating an entire top surface of the substrate with a pulsed light at a pulse width of about 0.1 ms to about 100 ms, in synchronization with the preheating;
   wherein the areas include semicircular first and second areas which are allocated in a mirror symmetry with respect to a diameter of the substrate.

3. The method of claim 1, wherein each of the areas is preheated to a temperature range of about 300° C. to about 600° C.

4. The method of claim 1, wherein the pulsed light is irradiated at an irradiation energy density in a range of about 15 $J/cm^2$ to about 40 $J/cm^2$.

5. The method of claim 1, wherein the areas further include a third area between the first and second areas.

6. The method of claim 5, wherein the third area is simultaneously preheated with the preheating.

7. A method for manufacturing a semiconductor device, comprising:
   defining laterally a plurality of areas in a semiconductor substrate;
   treating the semiconductor substrate by a first manufacturing process including:
      individually preheating each of the areas; and
      irradiating an entire top surface of the semiconductor substrate with a pulsed light at a pulse width of about 0.1 ms to about 100 ms, in synchronization with the preheating; and
   treating the semiconductor substrate by a second manufacturing process;
   wherein the areas include a first area assigned at a central part of the semiconductor substrate and a second area outside the first area including an edge of the semiconductor substrate.

8. A method for manufacturing a semiconductor device, comprising:
   defining laterally a plurality of areas in a semiconductor substrate;
   treating the semiconductor substrate by a first manufacturing process including:
      individually preheating each of the areas; and
      irradiating an entire top surface of the semiconductor substrate with a
   pulsed light at a pulse width of about 0.1 ms to about 100 ms, in
   synchronization with the preheating; and
   treating the semiconductor substrate by a second manufacturing process;
   wherein the areas include semicircular first and second areas which are allocated in a mirror symmetry with respect to a diameter of the semiconductor substrate.

9. The method of claim 7, wherein each of the areas is preheated to a temperature range of about 300° C. to about 600° C.

10. The method of claim 7, wherein the pulsed light is irradiated at an irradiation energy density in a range of about 15 $J/cm^2$ to about 40 $J/cm^2$.

11. The method of claim 7, wherein the areas further include a third area between the first and second areas.

12. The method of claim 11, wherein the third area is simultaneously preheated with the preheating.

13. The method of claim 2, wherein each of the areas is preheated to a temperature range of about 300° C. to about 600° C.

14. The method of claim 2, wherein the pulsed light is irradiated at an irradiation energy density in a range of about 15 $J/cm^2$ to about 40 $J/cm^2$.

15. The method of claim 8, wherein each of the areas is preheated to a temperature range of about 300° C. to about 600° C.

16. The method of claim 8, wherein the pulsed light is irradiated at an irradiation energy density in a range of about 15 $J/cm^2$ to about 40 $J/cm^2$.

* * * * *